United States Patent [19]

Gerke et al.

[11] Patent Number: 4,851,967
[45] Date of Patent: Jul. 25, 1989

[54] DISTRIBUTION BANK FOR COMMUNICATION CABLES

[75] Inventors: Dieter Gerke; Heide Teichler, both of Berlin, Fed. Rep. of Germany

[73] Assignee: Krone Aktiengesellschaft, Fed. Rep. of Germany

[21] Appl. No.: 174,724

[22] Filed: Mar. 29, 1988

[30] Foreign Application Priority Data

Apr. 1, 1987 [DE] Fed. Rep. of Germany ....... 3710896

[51] Int. Cl.[4] .............................................. H01R 9/00
[52] U.S. Cl. .................... 361/426; 361/428; 439/709; 439/721; 439/723
[58] Field of Search ............. 174/51 R; 361/331, 426, 361/428, 429; 379/27, 30, 327, 332, 399; 439/92, 101, 103, 709, 721, 723, 724

[56] References Cited

U.S. PATENT DOCUMENTS

| | | | |
|---|---|---|---|
| 3,005,180 | 10/1961 | Dreher | 439/721 |
| 3,936,133 | 2/1976 | Splitt et al. | 439/719 |
| 3,947,732 | 3/1976 | Cwirzen | 361/426 |
| 4,220,392 | 9/1980 | Debaist | 439/94 |
| 4,270,835 | 6/1981 | Kordt et al. | 439/94 |
| 4,541,682 | 9/1985 | Gerke et al. | 439/101 |
| 4,729,064 | 3/1988 | Singer, Jr. | 361/426 |

Primary Examiner—A. D. Pellinen
Assistant Examiner—Gregory P. Thompson
Attorney, Agent, or Firm—McGlew & Tuttle

[57] ABSTRACT

The invention relates to a distribution bank for communication cables in particular a house incoming distribution bank. The distribution bank includes several plug accommodation sections formed each by four conductor plug sockets, one earth plug socket, connecting elements and plug sockets and being provided with test portions for test plugs. In order to obtain a simple electrical connection between the plug accommodation sections, the connecting elements and the test positions, the plug accommodation sections, the plug sockets and the connecting elements are arranged in parallel rows. A row of the plug accommodation sections is arranged centrally, and one row each of test plug sockets and connecting elements are arranged on both sides of the central row of plug accommodation sections. Connecting plates extend to the parallel rows and are plugged into the distribution bank. The connecting plates bear on one side a conductor plug socket, and on the other side, a connecting element which is formed as a cutting/clamping contract, and in the center, there is a test portion.

5 Claims, 4 Drawing Sheets

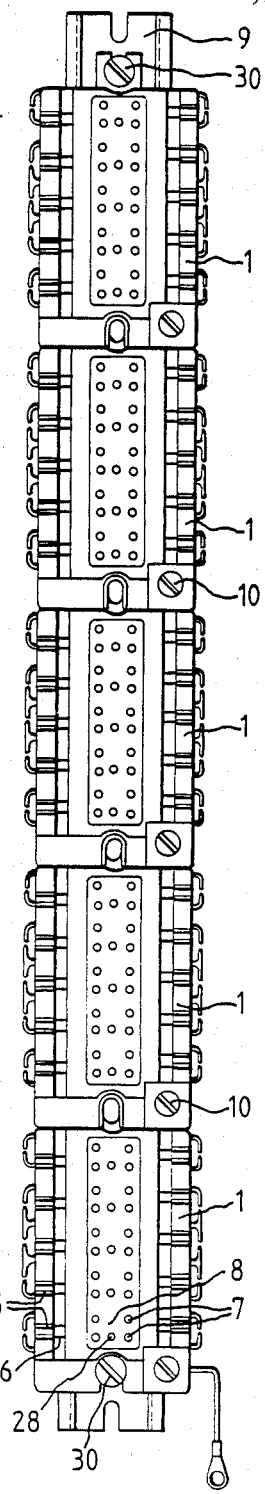
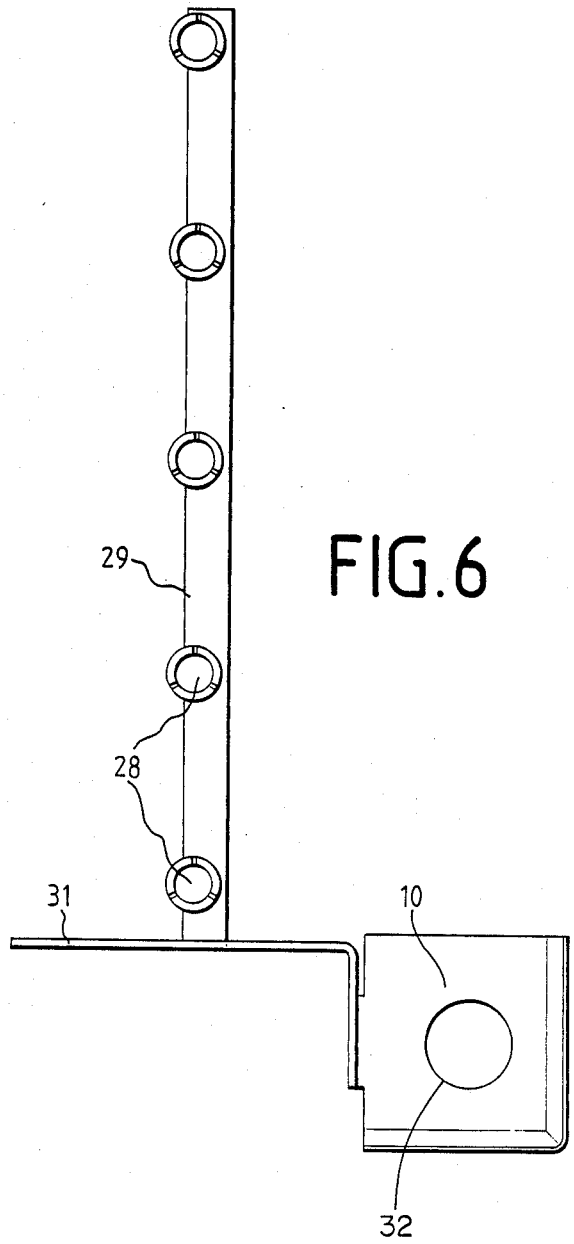
FIG.5
FIG.6

DISTRIBUTION BANK FOR COMMUNICATION CABLES

BACKGROUND OF THE INVENTION

1. Field of the Invention

The invention relates, in general, to electrical connections and, in particular, to a new and useful distribution bank for communication cables, in particular an incoming distribution bank for houses.

From the company brochure of Cook Electric, "Description and Installation, Type C-303, Main Frame Connector", a similar distribution bank is known. It includes a bearing plane, on the back side of which the cable formed by a plurality of cable wires is fastened. On the front side of the bearing plate, in the upper and lower section, test fields are formed, and in the center section, a connection field is formed on one side, and a disconnect or protection field, respectively, is formed on the other side. The cable wires were connected by a wire-wrap technique to pins arranged on the front and on the back side of the connection field. For connecting to the pins on the front side of the connection field, the cable wires are passed from the back side to the front side through corresponding openings. It is disadvantageous with this distribution bank that the four fields (connection field, test fields, disconnect and protection field) on the back side of the bearing plate have to be wired to each other. For this purpose, pins are provided on the back side of the disconnect and separation field. The pins are connected to plug sockets on the front side for accommodation of five-pole plugs. Further, there are also pins assigned to the test fields on the back side. The pins of the four fields are wired to each other. Thus, an assignment of a line, ie., the assignment of incoming cable wires to the outgoing cable wires and their disconnecting point, is very difficult and unclear.

SUMMARY OF THE INVENTION

The invention provides a distribution bank provided with a clearly understandable arrangement of the fields (connection field, test field, disconnect and protection field) and with a simple electrical connection of these fields.

The incoming cable wires are connected to one row of connecting elements, and the outgoing cable wires are connected to the other row of connecting elements opposite to the first one. Thus, the connecting elements of the incoming and outgoing cable wires, the plug sockets for the test positions and the plug accommodation sections are disposed in a plane laterally to the rows, such that the quick and clear assignment of the disconnect and protection plug of the test plug to the cable wires of a line to be protected and disconnected or to be tested, respectively, can be performed. As multiple rows of test plug sockets are provided, tests in both directions are possible. As the connecting elements are connected to the test position and are connected to the plug accommodation section over a connecting plate, additional wirings are not necessary.

Further advantageous embodiments of the invention result from the subclaims. Several distribution banks can be mounted on a bearing rail. Thus, a house incoming distributor can be enlarged or reduced according to the number of required connections.

Accordingly, it is an object of the invention to provide a distribution bank, particularly, a house incoming distribution bank which comprises a distribution bank housing which has a central part with a plurality of laterally and transversely extending rows of plug accommodation sections including conductor plug sockets and insert plugs with rows of plug sockets and connecting elements arranged in parallel relationship on each side of a central part. The plug sockets are provided with a test position for test plugs. Each conductor plug sockets includes a sleeve connected conductively with a connecting element and a test position. A connecting plate extends transversely in the housing laterally of the rows and connects and bears on each conductor plug socket. The connecting element is formed as a cutting and clamping contact.

A further object of the invention is to provide an electrical distribution bank which is simple in design, rugged in construction and economical to manufacture.

The various features of novelty which characterize the invention are pointed out with particularly in the claims annexed to and forming a part of this disclosure. For a better understanding of the invention, its operating advantages and specific objects obtained by its uses, reference is made to the accompanying drawings and descriptive matter in which is preferred embodiment of the invention is illustrated.

BRIEF DESCRIPTION OF THE DRAWINGS

In the Drawings:

FIG. 5 is a top plan view of several distribution banks mounted on the bearing rail;

FIG. 6 is a top plan view of an earth or ground plate to be inserted into the distribution bank with five earth plug sockets;

DESCRIPTION OF THE PREFERRED EMBODIMENTS

Figure 1:
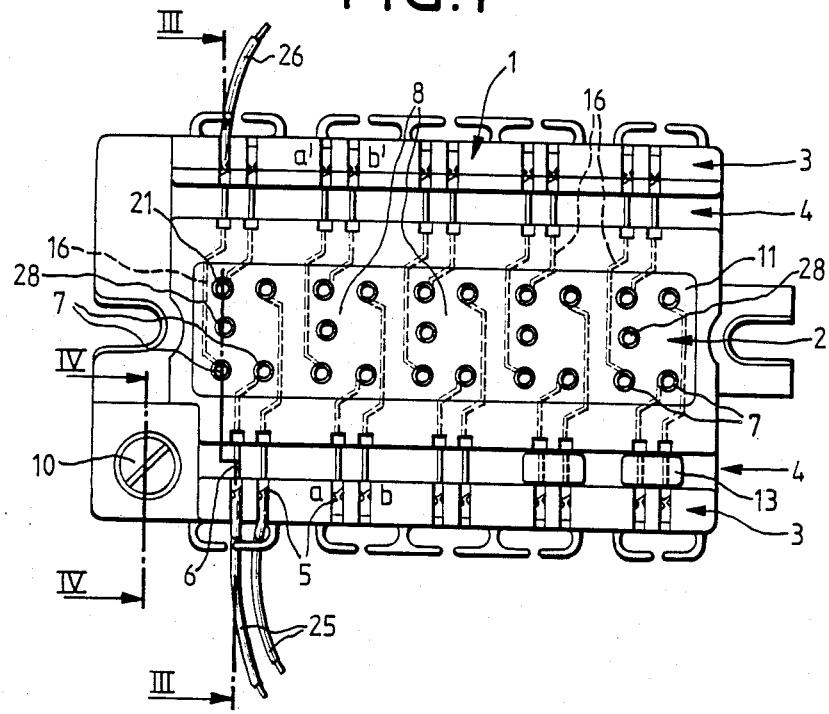
FIG. 1 is a top view of a distribution bank constructed in accordance with the invention.

Referring to the drawings, in particular, the invention embodied therein comprises a incoming distribution bank housing 1 which has a central row part 2 of plug accommodation sections. In addition an outer row 3 of connecting elements 5 and a row 4 of test plug sockets 13 are arranged in parallel on each side of the central portion of row 2.

Figure 2:
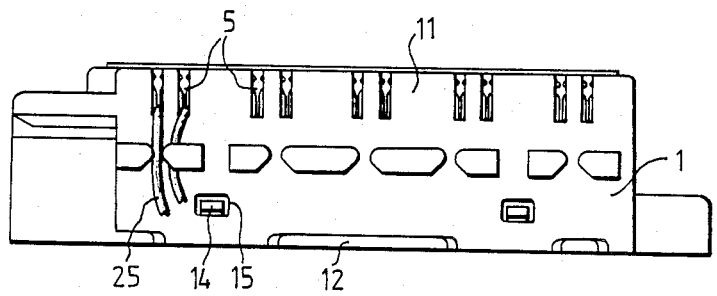
FIG. 2 is a side elevational view of the distribution bank.

As seen in FIG. 2, the distribution bank or housing 1 is made of plastic material and includes an upper part 11 and a lower part 12 to be snapped into the upper part 11. For snapping-on, latch hooks 14 provided at the lower part 12 engage into openings 15 arranged and shaped at the upper part 11.

As seen in FIG. 1, the distribution bank 1 exhibits a central row 2 of plug accommodation sections 8, two adjacent rows 4 of test plug sockets 13 and two outer rows 3 of connecting elements 5. Into the distribution bank 1, connecting plates 16 are inserted laterally to central row 2, the connecting plates 16 bearing, on one side, a conductor plug socket 7 of the plug accommodation section 8; and on the outer side, the connecting element 5 formed as cutting/clamping contact. In the center, a test portion 6 extends into the test plug socket 13. The cutting/clamping contact of the connecting element 5 has two legs 17, 18, between which a clamping slot 19 is formed, into which a cable wire 25, 26 to be connected is inserted for creating a contact connection, and simultaneously cutting into the cable insulation. The legs 17, 18 of the cutting/clamping contact are displaced by 45° with respect to the cable axis. The conductor plug sockets 7 and the earth plug sockets 28 are associated with a plug accommodation section. Little tubes or plug sockets 7 and 28 are open towards the top and have three elastic legs for accommodation of a pin contact 23 or of an earth contact pin 27. Centrally, an earth plate 29 with its central plug sockets 28 is inserted into the distribution bank 1. Four conductor plug sockets 7 and one earth plug socket 28 form one plug accommodation section 8 which is provided for accommodation of a disconnect and protection plug 22. The individual conductor plug sockets 7 and earth plug sockets are formed of sleeve portions 28 accommodated in corresponding bore holes 21 of the distribution bank 1.

For disconnectin and protection of the cable wires 25 and 26 connected on both sides of the distribution bank 1, the disconnect and protection plug 22 is inserted into the plug accommodation section 8. The disconnect and protection plug 22 exhibits four pin contacts 23 and a central earth contact pin 27. The length of two pin contacts 23 is shorter than those of the other two pin contacts 23 and of the central earth contact pin 27. By inserting the disconnect and protection plug 22, the cable wires 25, 26 are electrically connected to each other and are, simultaneously, protected against overvoltage. Disconnection of this line is effected by pulling the disconnect and protection plug 22 out up to a marking 24 provided on the pin contacts 23. In this position of the disconnection and protection plug 22, the cable wires are further protected against overvoltage, because the longer contact pin 27 and the longer two pin contacts 23 remain connected to the plug sockets 7, 28 maintain, the protection of one cable side. The disconnect and protection plug 22 can quickly and clearly be assigned to the cable wires 25 and 26 to be disconnected and to provide protection of a line. This is provided by the arrangement of the connecting elements 5, the plug accommodation sections 8 and the plug test sockets 13 which are arranged on the same plane.

For test purposes, test plugs 20 can be inserted into the test plug sockets 13. This arrangement allows the test plugs 20 to be electrically connected to the assigned test portion 6 of and to the assigned connecting element 5. As two rows 4 of test plug sockets 13 are provided, tests can be performed in both directions.

Figure 4:
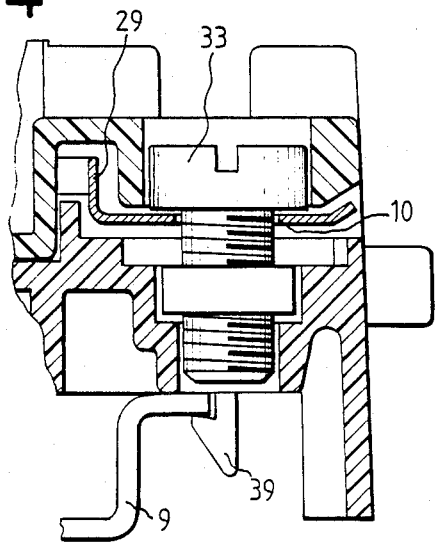
FIG. 4 is a cross section taken along the line IV—IV IN FIG. 1.

As shown in FIG. 6, the earth plate 29 of a distribution bank 1 has five earth plug sockets 28, one earth or ground connection 10 and one contact tongue 31. The earth connection 10 has centrally a bore hole 32 for the earth connection screw 33 (FIG. 4). For earthing, an earth cable is clamped to this earth connection screw 33, the central earth plug sockets 28 being, thus, on an earth potential.

Figure 3:
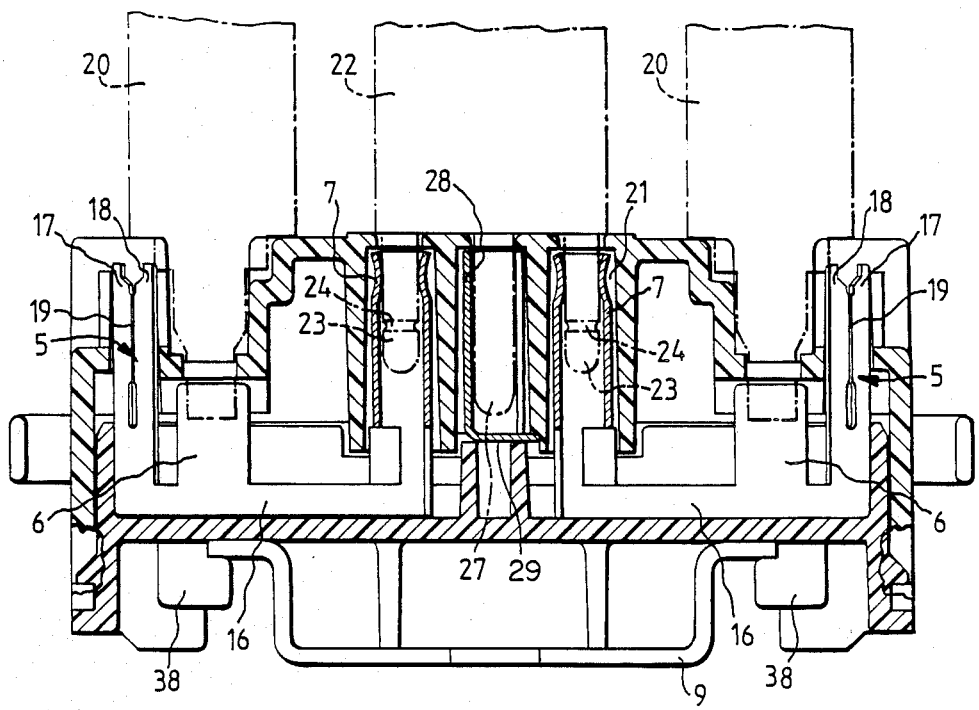
FIG. 3 is a cross section taken aling the line III—III in FIG. 1.
Figure 7:
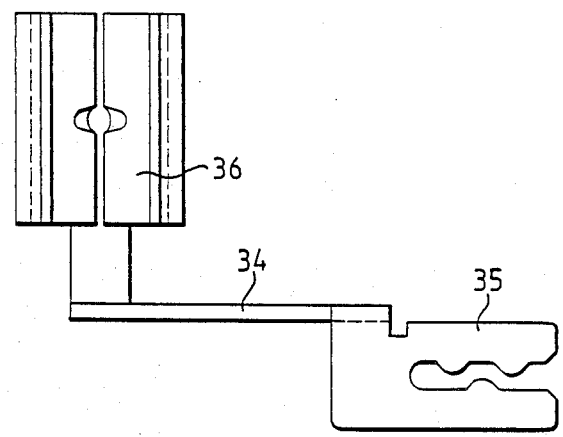
FIG. 7 is a top plan view of an earth terminal for connecting the earth plate with the bearing rail.
Figure 8:
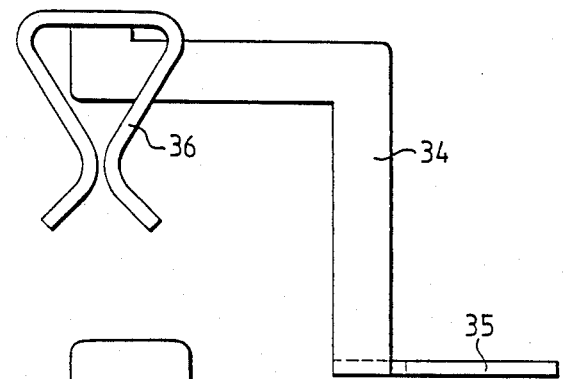
FIG. 8 is a side elevational view of the earth terminal.
Figure 9:
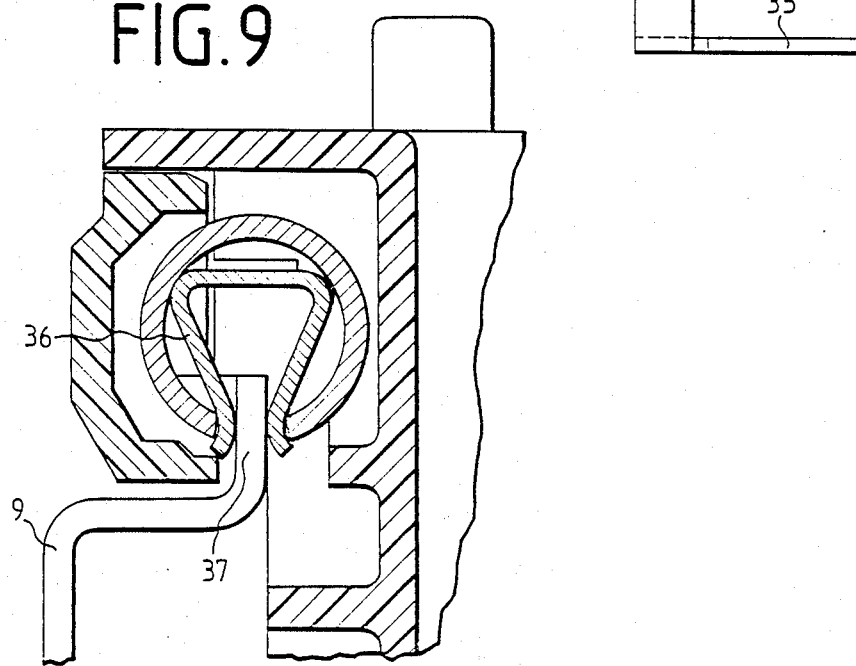
FIG. 9 is a partial sectional through the distribution bank with earth terminal mounted on the bearing plane.

As shown in FIG. 5, several distribution banks 1 can be mounted one behind the other on a metal bearing rail 9. The distribution bank 1 has, for this purpose, on the underside a clamping element 38 (FIG. 3) and a latch hook 39 (FIG. 4) engaging under the bearing rail 9. The outer distribution banks 1 arranged in a row are secured additionally by means of screws 30 against displacement in longitudinal direction. In order that, with this row-type arrangement of distribution banks 1, it is not necessary to wire each earth connection 10 with an earth cable. An earth terminal 34 shown in FIGS. 7 and 8 can be mounted into each distribution bank 1. The earth terminal 34 connects the earth plate 29 to the bearing rail 9. For this purpose, the earth terminal 34 is provided with a fork contact or clamping contact 35 and an elastic clamping contact 36. The fork contact 35 is connected to the contact tongue spring 31 of the earth plate 29. The clamping contact 36 is slid on both sides, as shown in FIG. 9, over the base wall 37 of the bearing rail 9 and connects, thus, the bearing rail 9 to the central earth plug sockets 28 and to the earth connection 10. The bearing rail 9 serves, thus, as protective conductor bus bar with an electrical connection to the central earth connection 10.

While specific embodiments of the invention have been shown and described in detail to illustrate the application of the principles of the invention, it will be understood that the invention may be embodied otherwise without departing from such principles.

What is claimed is:

1. An electrical distribution bank for communication cables, comprising:
    a housing with an incoming cable distribution bank having a central part;
    a plurality of plug accommodation sections, each accommodation section having four conductor plug sockets and an earth plug socket; a row of test plug sockets;
    a row of connecting elements, said row of test plug sockets and said row of connecting elements being arranged in parallel relationship to each other on each side of said central part, each of said test plug sockets being provided with a test portion for contacting a test plug;
    a plurality of connecting plates extending transversely in said housing laterally of said rows, each connecting plate bearing on and in contact with a portion of one of said conductor plug sockets and connected conductively with each of said connecting elements of said row of connecting elements, each of said connecting elements including a cutting and clamping contact, said test portion electrically connected to said cutting and clamping contact and said connecting plate.

2. A distribution bank according to claim 1, further comprising: an earth plate connected to each of said earth plug sockets for each plug accommodation section.

3. A distribution bank according to claim 2, further comprising an earth connection adapted to be connected to ground and a contact tongue connecting said earth connection to said earth plate.

4. A distribution bank according to claim 3, wherein said contact tongue has a clamping contact portion.

5. A distribution bank according to claim 1, wherein a plurality of distribution bank housings are arranged, one behind the other, and including a metal bearing rail carrying said housings.

* * * * *